(12) United States Patent
Kojima

(10) Patent No.: US 8,032,847 B2
(45) Date of Patent: Oct. 4, 2011

(54) LAYOUT DESIGN METHOD OF SEMICONDUCTOR INTEGRATED CIRCUIT

(75) Inventor: Masahiro Kojima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 339 days.

(21) Appl. No.: 12/320,325

(22) Filed: Jan. 23, 2009

(65) Prior Publication Data

US 2009/0217223 A1 Aug. 27, 2009

(30) Foreign Application Priority Data

Feb. 26, 2008 (JP) ................. 2008-044501

(51) Int. Cl.
*G06F 17/50* (2006.01)
*G06F 9/45* (2006.01)

(52) U.S. Cl. ............ 716/106; 716/50; 716/52; 716/103; 716/104; 716/112; 716/132; 716/136

(58) Field of Classification Search ............ 716/50, 716/52, 103, 104, 106, 112, 132, 136; 703/14
See application file for complete search history.

(56) References Cited

U.S. PATENT DOCUMENTS

| | | | | |
|---|---|---|---|---|
| 5,084,824 A * | 1/1992 | Lam et al. | ...... | 716/103 |
| 5,392,222 A * | 2/1995 | Noble | ...... | 716/52 |
| 5,675,499 A * | 10/1997 | Lee et al. | ...... | 324/755.01 |
| 5,825,191 A * | 10/1998 | Niijima et al. | ...... | 324/754.22 |
| 6,965,853 B2 * | 11/2005 | Kuzuma et al. | ...... | 703/14 |
| 6,978,437 B1 * | 12/2005 | Rittman et al. | ...... | 257/659 |
| 7,117,462 B2 * | 10/2006 | Kimura et al. | ...... | 716/112 |
| 7,451,430 B2 * | 11/2008 | Miyagawa | ...... | 716/50 |
| 7,461,326 B2 * | 12/2008 | Kanamaru | ...... | 714/760 |
| 7,681,159 B2 * | 3/2010 | Matsuoka et al. | ...... | 716/113 |
| 7,716,611 B2 * | 5/2010 | Pikus et al. | ...... | 716/132 |
| 7,812,694 B2 * | 10/2010 | Ding et al. | ...... | 333/238 |
| 7,853,909 B2 * | 12/2010 | Kobayashi et al. | ...... | 703/14 |
| 2004/0049747 A1 * | 3/2004 | Yamasaki et al. | ...... | 716/4 |
| 2007/0009836 A1 * | 1/2007 | Yanagisawa | ...... | 430/311 |
| 2009/0077527 A1 * | 3/2009 | Gergov et al. | ...... | 716/21 |
| 2009/0089037 A1 * | 4/2009 | Yamada | ...... | 703/14 |
| 2009/0254870 A1 * | 10/2009 | Kojima | ...... | 716/2 |
| 2009/0288055 A1 * | 11/2009 | Shankar et al. | ...... | 716/12 |
| 2010/0242011 A1 * | 9/2010 | Mukai et al. | ...... | 716/19 |
| 2010/0306720 A1 * | 12/2010 | Pikus et al. | ...... | 716/5 |

FOREIGN PATENT DOCUMENTS

| | | |
|---|---|---|
| JP | 9-44559 | 2/1997 |
| JP | 09044559 A * | 2/1997 |

OTHER PUBLICATIONS

Shi; "Module recognition and its application to LVS of ASIC"; Publication Year: 2001; ASIC, 2001. Proceedings. 4th International Conference on; pp. 693-695.*

* cited by examiner

*Primary Examiner* — Helen Rossoshek
(74) *Attorney, Agent, or Firm* — McGinn IP Law Group, PLLC

(57) ABSTRACT

A layout design method of a semiconductor integrated circuit includes degenerating a layout netlist extracted from layout data, comparing the layout netlist after the reduction with a circuit diagram netlist, and creating a layout circuit association table of a layout cell after the reduction and a circuit element. The method includes creating a before and after reduction association table based on the layout netlist before and after the reduction, counting the number of layout elements in a layout cell area before the reduction, comparing the counted number of layout elements and the number of degenerated elements, and creating mapping information associating the layout cell with the circuit element.

6 Claims, 5 Drawing Sheets

LAYOUT DESIGN METHOD OF SEMICONDUCTOR INTEGRATED CIRCUIT

BACKGROUND OF THE INVENTION

1. Field of the Invention

The present invention relates to a layout design method of a semiconductor integrated circuit.

2. Description of Related Art

In recent years, an automation of analog layout design has progressed and a design period has been shortened. As a method of automating analog layout design, known is crossprobing that enables layout design while associating elements on a circuit diagram editor respectively with elements on a layout editor. Here, in order to perform layout design by cross-probing, it is necessary to create mapping information associating an element on the circuit diagram editor with a cell including an element on the layout editor.

For example, when making design revision using already-existing layout data, the design is generally performed by reading a layout into a design system via a mask pattern file in a binary form typically used for storing layout information (hereinafter, referred to as GDS2). Moreover, when using a layout designed by a different design system or using a layout data which is not designed in a circuit diagram-driven manner, it is necessary to create mapping information and then to read the mapping information into an integrated design system functioning as a circuit diagram editor and a layout editor. However, creating mapping information is difficult, and therefore a technology which facilitates mapping is required.

FIG. 5 is a system chart showing an embodiment of a layout verification method and a circuit simulation method described in FIG. 1 of Patent Document 1. As shown in FIG. 5, in the layout verification method and the circuit simulation method, prepared is, as an external tool, a SPICE netlist extraction tool 1 which can accurately extract a parasitic capacity, a resistance value and the like of a layout. The SPICE netlist extraction tool 1 processes a layout pattern 3 corresponding to circuit diagram data 2 to create a SPICE netlist 4.

With the process of creating the SPICE netlist 4, a netlister 5 reads the circuit diagram data 2 to be processed, performs an extraction process of a netlist, and thereby creates a circuit diagram netlist 6. Thereafter, a net comparer 7 performs a process of comparing the contents of the SPICE netlist 4 and the contents of the circuit diagram netlist 6. A SPICE vs circuit diagram node association table 8 and a verification result 9 are then created.

Moreover, in parallel with this process, a circuit simulator 10 performs a circuit simulation process based on the SPICE netlist 4 to create a circuit simulation result 11. When these processes are complete, a display portion 12 for displaying simulation result by cross-probing on the circuit diagram and LVS result displays the contents of the cross-probing of the circuit simulation result on a screen, based on the circuit simulation result 11, the SPICE vs circuit diagram node association table 8, and the circuit diagram data 2. At the same time, a result of LVS is displayed on a screen with a circuit diagram, based on the circuit simulation result 11, the verification result 9, and the circuit diagram data 2.

In Patent Document 1, a net comparison is made by comparing the SPICE netlist 4 extracted from the layout pattern 3 by the SPICE netlist extraction tool 1 is compared, with the circuit diagram netlist 6 extracted from the circuit diagram data 2 by the netlister 5. The SPICE vs circuit diagram node association table is then created to perform cross-probing.

[Patent Document 1] Japanese Patent Application Publication No. Hei 9-044559

SUMMARY

It is essential to create mapping information as shown in the above in order to perform cross-probing. However, there is a problem that mapping information cannot be created by the method of Patent Document 1 when there is a cell including a plurality of elements on a layout (layout elements) corresponding to a single element on a circuit diagram.

The reason for this will be described in detail hereinafter. General descriptions will first be given of the association of an element on a circuit diagram with an element on a layout with reference to FIG. 4. There are a plurality of representations on a layout conceivable even for one transistor (the gate length L, the gate width W) on a circuit diagram, as illustrated in FIGS. 4A to 4C.

FIG. 4A is an example of a layout diagram in the case where one transistor on a circuit diagram is configured as a layout cell 100 including one transistor on a layout. A channel region 103 with the gate length L and the gate width W is formed by superimposing a gate layer 102 over a diffusion layer 101 in the layout cell 100.

Here, the bottom left corner of the channel region 103 is defined as a transistor origin point 104 defined by the channel region 103, for example. Moreover, the bottom left corner of a cell area is defined as a cell origin point 105 for an origin point of the layout cell 100. Furthermore, the layout cell 100 also includes drain contacts 106 and source contacts 107.

FIG. 4B is an example of a layout diagram in the case where one transistor on a circuit diagram is configured as two layout cells 100a and 100b each of which includes a transistor on a layout. In FIG. 4B, two channel regions 103a and 103b with the gate length L and the gate width W/2 are formed by superimposing a gate layer 102a over a diffusion layer 101a and a gate layer 102b over a diffusion layer 101b, respectively.

Drain contacts 106a and 106b of the two transistors are connected to each other with a connection wire 108c. In addition, gates 102a and 102b of the two transistors are connected to each other with a connection wire 108b via a gate contact (unillustrated). Source contacts 107a and 107b of the two transistors are connected to each other with a connection wire 108a.

Here, origin points of the transistors defined by the channel regions 103a and 103b are defined as transistor origin points 104a and 104b, for example. Additionally, origin points of the layout cells 100a and 100b are defined as cell origin points 105a and 105b, for example. As shown in FIG. 4B, a transistor on a circuit diagram can be also built on a layout by connecting two layout cells, each of which includes a transistor whose gate length is half of W, in parallel.

FIG. 4C is an example of a layout diagram in the case where one transistor on a circuit diagram is configured as a transistor cell including two transistors on a layout. The two transistors in FIG. 4B are included not in separate cells but in a layout cell 100c. As shown in FIG. 4C, a transistor on a circuit diagram can be built on a layout by forming two transistors each having a gate length of half of W on a layout cell, and by connecting the two transistors in parallel.

As described above, it is possible to represent a transistor on a circuit with a plurality of layouts.

In Patent Document 1, for example, assuming that the circuit diagram data 2 indicates the one transistor described above and that the layout pattern 3 indicates the layout cell 100 in FIG. 4A, mapping information associating the transistor with the layout cell 100 on a one-to-one basis is required.

The net comparer 7 can associate the transistor defined by the channel region 103 in the layout cell 100 registered on the SPICE netlist 4 extracted from the layout pattern 3 by the SPICE net extraction tool 1 in FIG. 5 with the transistor registered on the circuit diagram netlist 6 extracted from the circuit diagram data 2 by the netlister 5 in FIG. 1, on a one-to-one basis. In this case, the layout cell 100 has only one transistor defined by the channel region 103. Therefore, it is possible to associate the transistor on the circuit diagram with the layout cell 100 on the one-to-one basis.

Similarly, in Patent Document 1, assuming that the circuit diagram data 2 indicates the one transistor and that the layout pattern 3 indicates the layout cells 100a and 100b in FIG. 4B, mapping information associating the transistor with the layout cells 100a and 100b on a one-to-two basis is required.

The net comparer 7 in FIG. 1 can associate the one transistor registered on the circuit diagram netlist 6 extracted from the circuit diagram data 2 by the netlister 5 in FIG. 5 with the two transistors which are extracted by the SPICE net extraction tool 1 from the layout pattern 3 and which are defined by the channel regions 103a and 103b registered on the SPICE netlist 4, on a one-to-two basis.

Moreover, the layout cell 100a has only one transistor defined by the channel region 103a. Therefore, it is possible to easily associate the layout cell 100a with the transistor. Similarly, the layout cell 100b has only one transistor defined by the channel region 103b. Therefore, it is possible to easily associate the layout cell 100b with the transistor. Consequently, it is possible to associate the transistor on the circuit diagram with the layout cells 100a and 100b on a one-to-two basis.

Similarly, in Patent Document 1, for example, assuming that the circuit diagram data 2 indicates the one transistor and that the layout pattern 3 indicates the layout cell 100c in FIG. 4C, mapping information associating the transistor with the layout cell 100c on a one-to-one basis is required.

The net comparer 7 can associate a transistor registered on the circuit diagram netlist 6 extracted from the circuit diagram data 2 by the netlister 5 in FIG. 5, with two transistors which are extracted from the layout pattern 3 by the SPICE net extraction tool 1 and which are defined by the channel regions 103a and 103b registered on the SPICE netlist 4, on a one-to-two basis. However, the layout cell 100c includes the two transistors. Accordingly, it is not possible to associate the layout cell 100c with the two transistors. Hence, it is not possible to create the mapping information associating the one transistor on the circuit diagram with the layout cell 100c on the one-to-one basis.

A layout design method of a semiconductor integrated circuit, according to an exemplary aspect of the present invention, is a lay out design method for degenerating a layout netlist extracted from layout data, comparing the layout netlist after the reduction with a circuit diagram netlist, and creating a layout circuit association table of a layout cell after reduction and a circuit element. The method includes creating a before and after a reduction association table based on the layout netlists before and after the reduction; counting the number of layout elements in a layout cell area before the reduction, comparing the counted number of layout elements and the number of degenerated elements, and creating mapping information associating the layout cell with the circuit element.

The exemplary aspect of the present invention facilitates creation of mapping information necessary for cross-probing.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
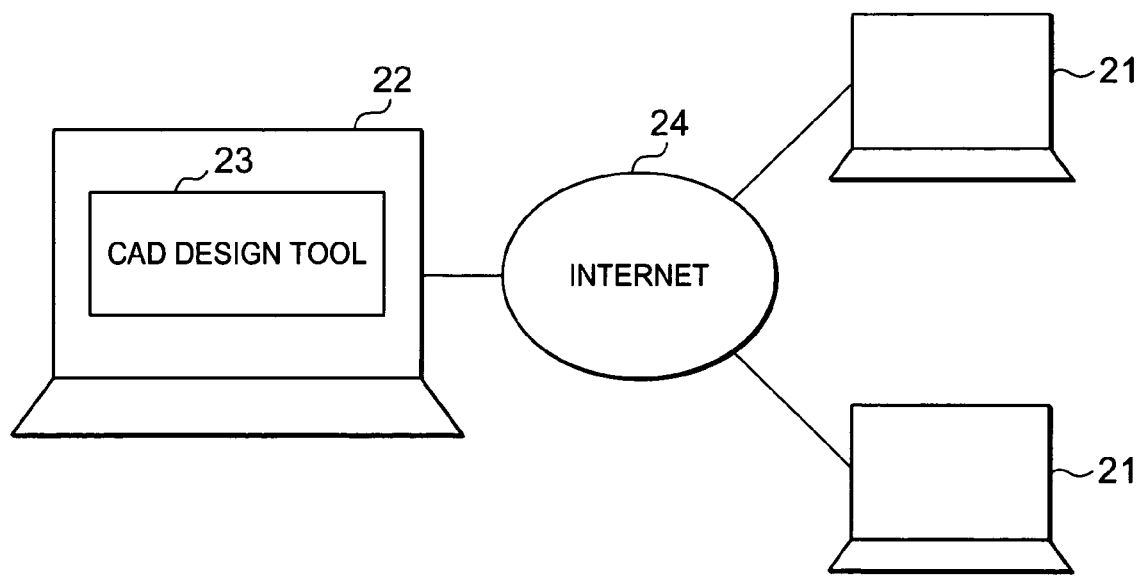
FIG. 1 is a system configuration diagram for practicing an exemplary embodiment of the present invention.

FIG. 1 is a system configuration diagram for carrying out an exemplary embodiment of the present invention. The system is configured of computer apparatuses 21, a server 22, a recording medium 23 and a network 24.

The recording medium 23 is held in the server 22 provided to offer an execution program, a model expression and a model parameter. The server 22 is connected to each of the computer apparatuses 21 such as an engineering workstation via the network 24 such as the Internet. A CAD design tool (a circuit editor, a layout editor, and the like) stored in the recording medium 23 is downloaded to the computer apparatus 21 via the network 24. The downloaded CAD design tool is stored in a local hard disk or memory of the computer apparatus 21.

Figure 2:
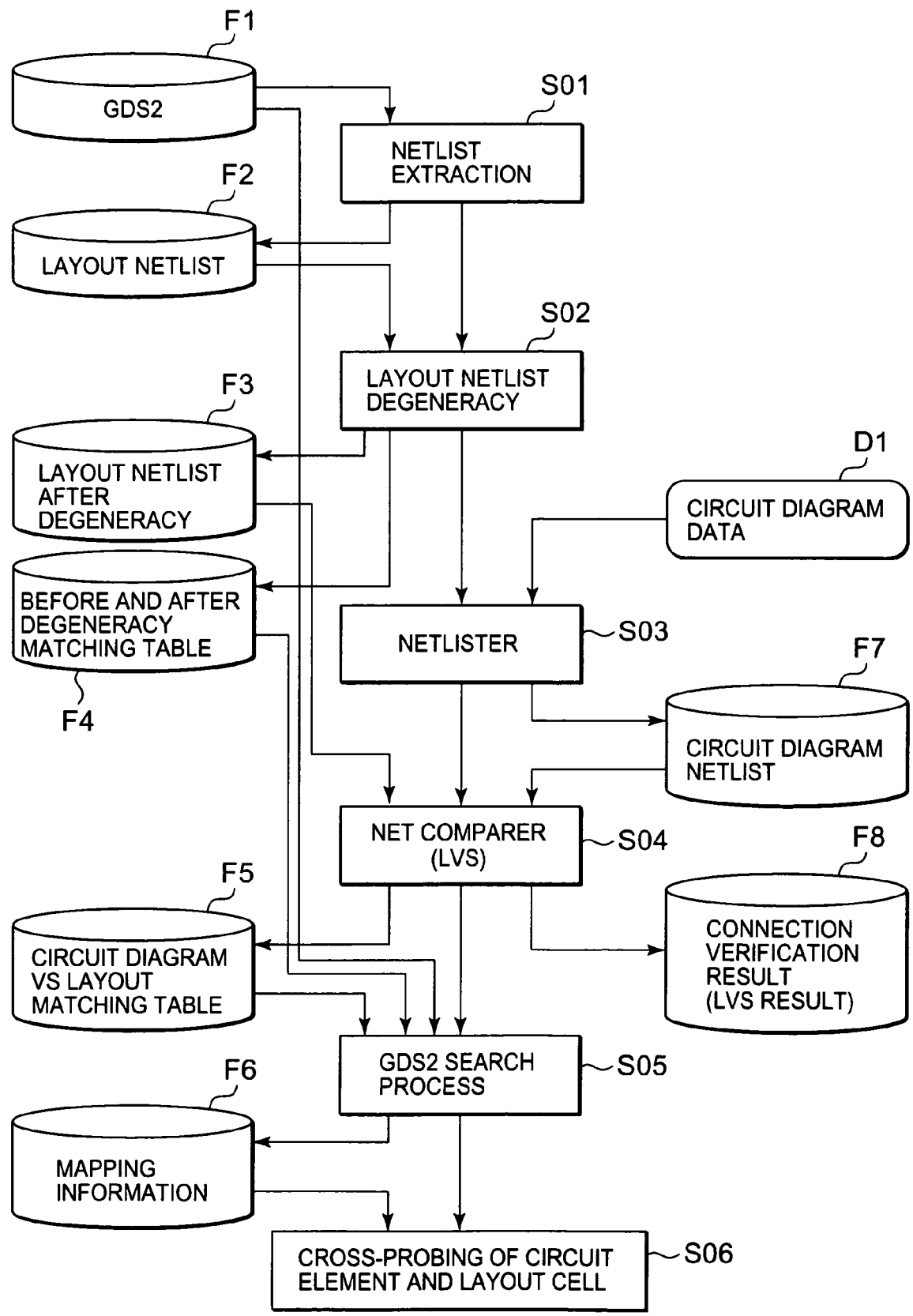
FIG. 2 is a flowchart of cross-probing according to an exemplary embodiment.
Figure 3:
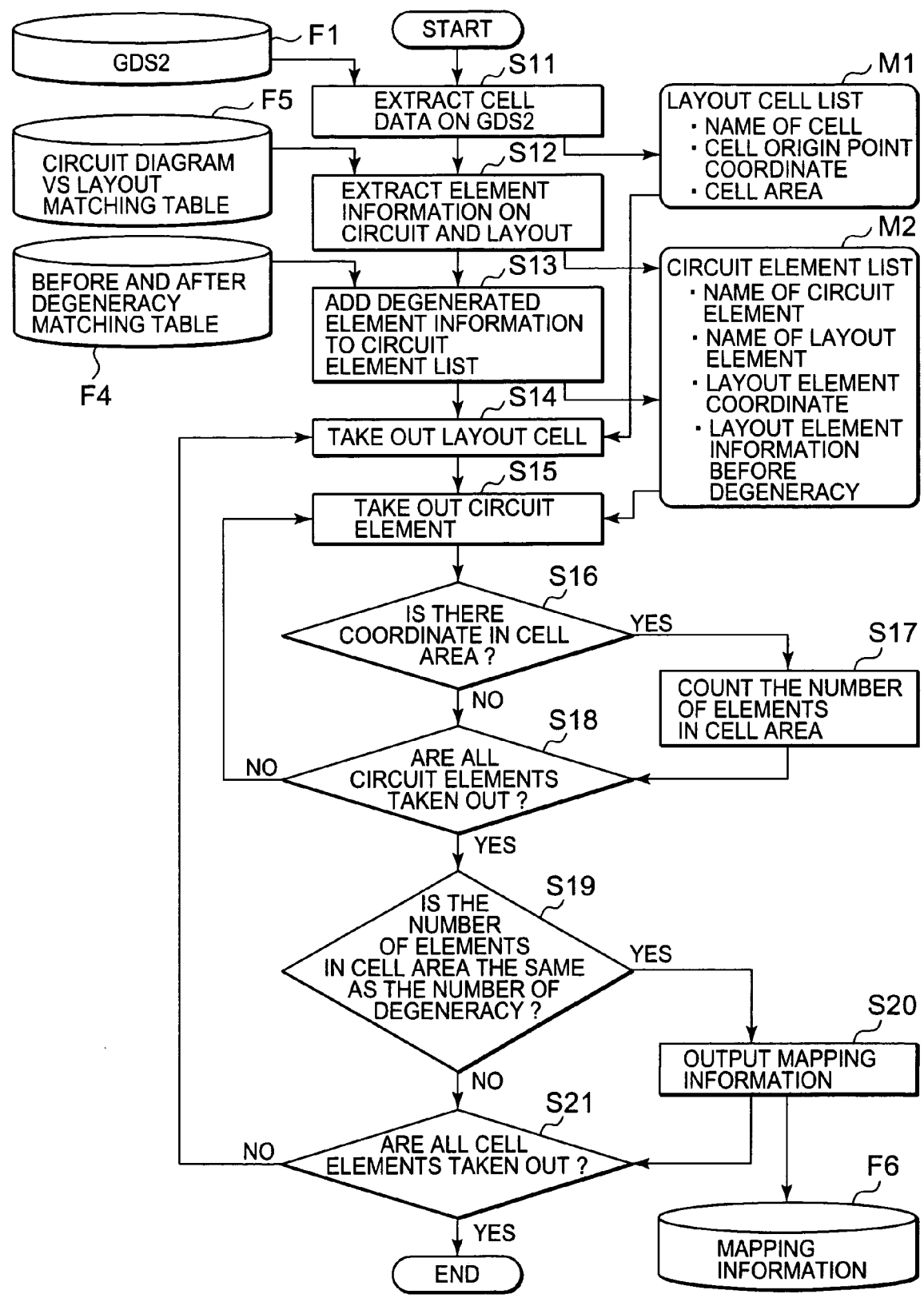
FIG. 3 is a flowchart of a method for recognizing layout cells according to the exemplary embodiment.

Next, descriptions will be given of a method for performing cross-probing between a circuit diagram and a layout according to the exemplary embodiment. FIG. 2 is a flowchart of cross-probing according to the exemplary embodiment. FIG. 3 is a flowchart of a method for recognizing a layout cell according to the exemplary embodiment, and describes S05 (a GDS2 search process) in FIG. 2 in detail. In the exemplary embodiment, layout data stored as GDS2 is read into a layout editor to perform cross-probing. As described above, cross-probing requires mapping information that associates an element on a circuit diagram editor with a cell including an element on a layout editor.

As shown in FIG. 2, GDS2 F1 is first read to create a layout netlist F2 in a netlist extraction Step S01.

Next, the layout netlist F2 is read to create an after reduction layout netlist F3 and a before and after reduction association table F4 in a layout netlist reduction Step S02. Reduction will be described. For example, when a layout of a 1000Ω resistor on a circuit diagram is designed, it is general to have a configuration where five 200Ω resistors are connected in series on a layout, and the like. In such a case, it is not possible to judge the configuration to be the same in LVS if they are left as they are, since the number of resistors on a circuit is different from the number of resistors on a layout. Therefore, a process of replacing the above five resistors to simulate one resistor is performed. Such a process is called "reduction" in the specification. Please note that the reduction can be performed not only on a layout but also on a circuit diagram.

Next, circuit diagram data D1 is read to create a circuit diagram netlist F7 in Step S03 of performing a netlister process.

Next, in Step S04 of performing a net comparison (LVS), the circuit diagram netlist F7 is checked against the after reduction layout netlist F3 to create a connection verification result (an LVS result) F8 and a circuit diagram vs layout association table F5.

Next, in a GDS2 search processing Step S05, GDS2 F1 and the circuit diagram vs layout association table F5 and the before and after reduction association table F4 are read to create mapping information F6 on a circuit element and a layout cell by searching for a cell held by GDS2 F1 from the coordinates of transistor origin points held by the circuit diagram vs layout association table F5 and the before and after reduction association table F4.

Lastly, in Step S06 of cross-probing of a circuit element and a layout cell, the mapping information F6 on a circuit element and a layout cell is read to achieve the cross-probing of a circuit element and a layout cell.

Moreover, detailed descriptions will be given of processes from the GDS2 search process Step S05 to Step S06 of cross-probing of the circuit element and the layout cell in FIG. 2 with reference to FIG. 3.

When the net comparison process step S04 in FIG. 2 is complete, in Step S11 of extracting cell data on GDS2, GDS2 F1 is read to output to a layout cell list M1 a cell name, the coordinates of a cell origin point, and a cell area as data on each cell.

Next, in Step S12 of extracting element information on circuit and layout, the circuit diagram vs layout association table F5 is read to output, to a circuit element list M2, a circuit element name, the name of a layout element associated with a circuit element, and the coordinates of a layout element (a transistor origin point) as data on each circuit element.

Next, in Step S13 of adding degenerated element information to the circuit element list, the before and after reduction association table F4 is read to add layout element information before reduction (the name of a layout element before reduction and the coordinates of a layout element before reduction) to the circuit element list M2.

Next, in Step S14 of taking out the layout cells, one piece of cell data is taken out from the layout cell list M1.

Next, in Step S15 of taking out the circuit elements, one piece of cell data is taken out from the layout cell list M2.

Next, in Step S16 of judging whether or not an element has a coordinates in a cell area, it is checked whether or not the coordinates of the layout element before reduction exist in the cell area. If YES, that is, if the coordinates of the layout element are contained in the cell area, then elements in the cell area are counted in Step S17 of counting number of elements in a cell area. Then, the processing goes to the next Step S18. On the other hand, if NO, that is, if elements are not contained, then the processing goes from Step S16 to Step S18.

In Step S18 of judging whether or not all of circuit elements are taken out, it is checked whether or not the processing for all circuit elements registered on the circuit element list M2 is complete. If NO, that is, if some elements are still left, then the processing goes back to Step S15 of taking out circuit elements. On the other hand, if YES, that is, if all the processing is complete, then the processing goes to the next Step S19.

In Step S19 of judging whether or not the number of reduction and the number of elements in a cell area are the same, the number of degenerated elements is compared with the number of elements in a cell area. If YES, that is, if they are the same, then the processing goes to Step S20 of outputting mapping information on a circuit element and a layout cell, and then the names of a circuit element, a layout element and a layout cell, and the coordinates of the layout cell are outputted to the mapping information F6 on the circuit element and the layout cell. If NO, that is, if they are different, then the processing goes to the following Step S21.

In Step S21 of judging whether or not all the cells are taken out, it is checked whether or not the processing of all the layout cells registered on the layout cell list M1 is complete. If NO, that is, some cells are still left, then the processing goes back to Step S14 of taking out layout cells. If yes, that is, the processing is complete, then the processing is terminated.

As described above, the exemplary embodiment includes means for: creating the before and after reduction association table F4; creating the circuit vs layout association table by LVS; registering a cell name, a cell origin point coordinates, and a cell area on the layout cell list M11 from GDS2 F1; registering a circuit element name, a layout element name, layout element coordinates on the circuit element list M2; additionally registering the coordinates of a layout element before reduction on the circuit element list M2; searching for a transistor origin point in a cell area; and comparing the number of transistor origin points in the cell area with the number of transistors before reduction obtained from the before and after reduction association table.

In the exemplary embodiment, a search is performed on layout cells on GDS2, by using: the before and after reduction association table obtained by degenerating a layout netlist as preprocessing of LVS; and the circuit diagram vs layout association table which associates circuit elements with layout elements obtained by executing LVS on a one-to-one basis. Then, mapping information on a one-to-one or one-to-multiple relationship of transistors on a circuit diagram and on a layout can be created by using agreement between the number of the transistor origin points and number of the degenerated elements found in the layout cell.

Figure 4A:
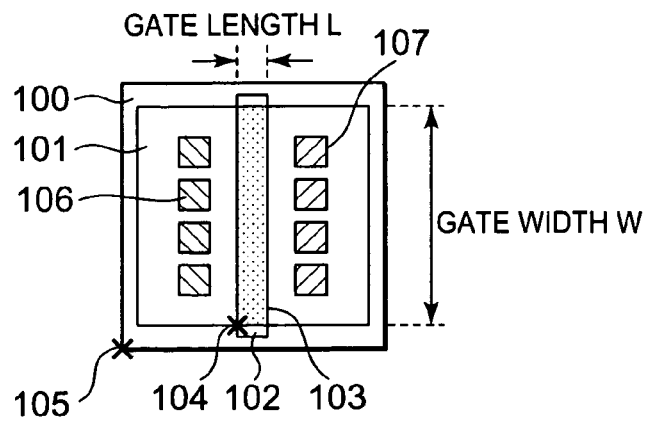
FIG. 4A to FIG. 4C are examples of layouts each corresponding to a transistor on a circuit diagram.
Figure 4B:
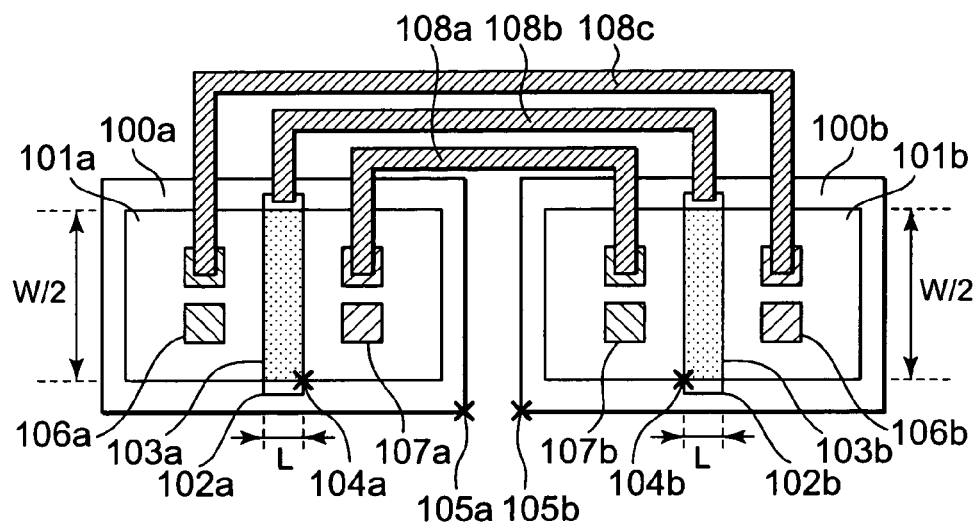
Figure 4C:
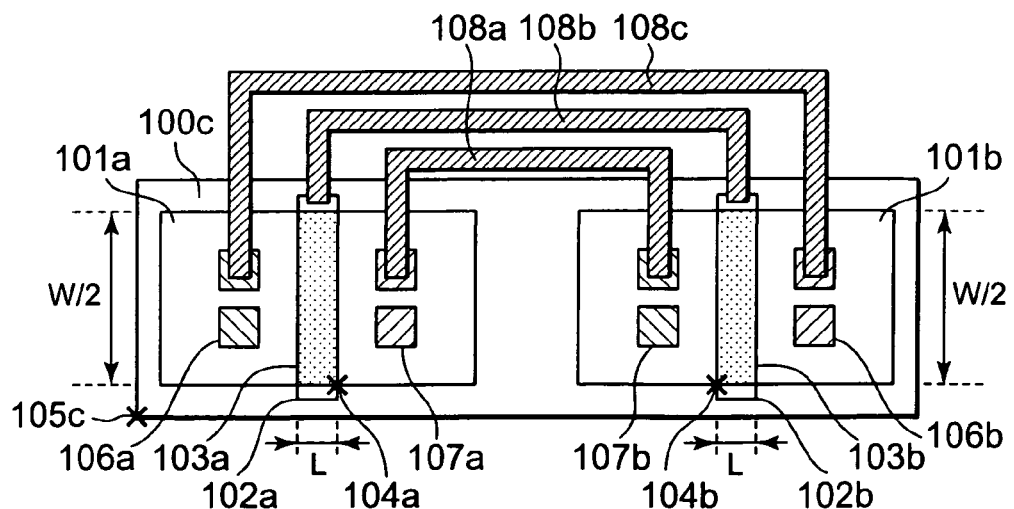
Figure 5:
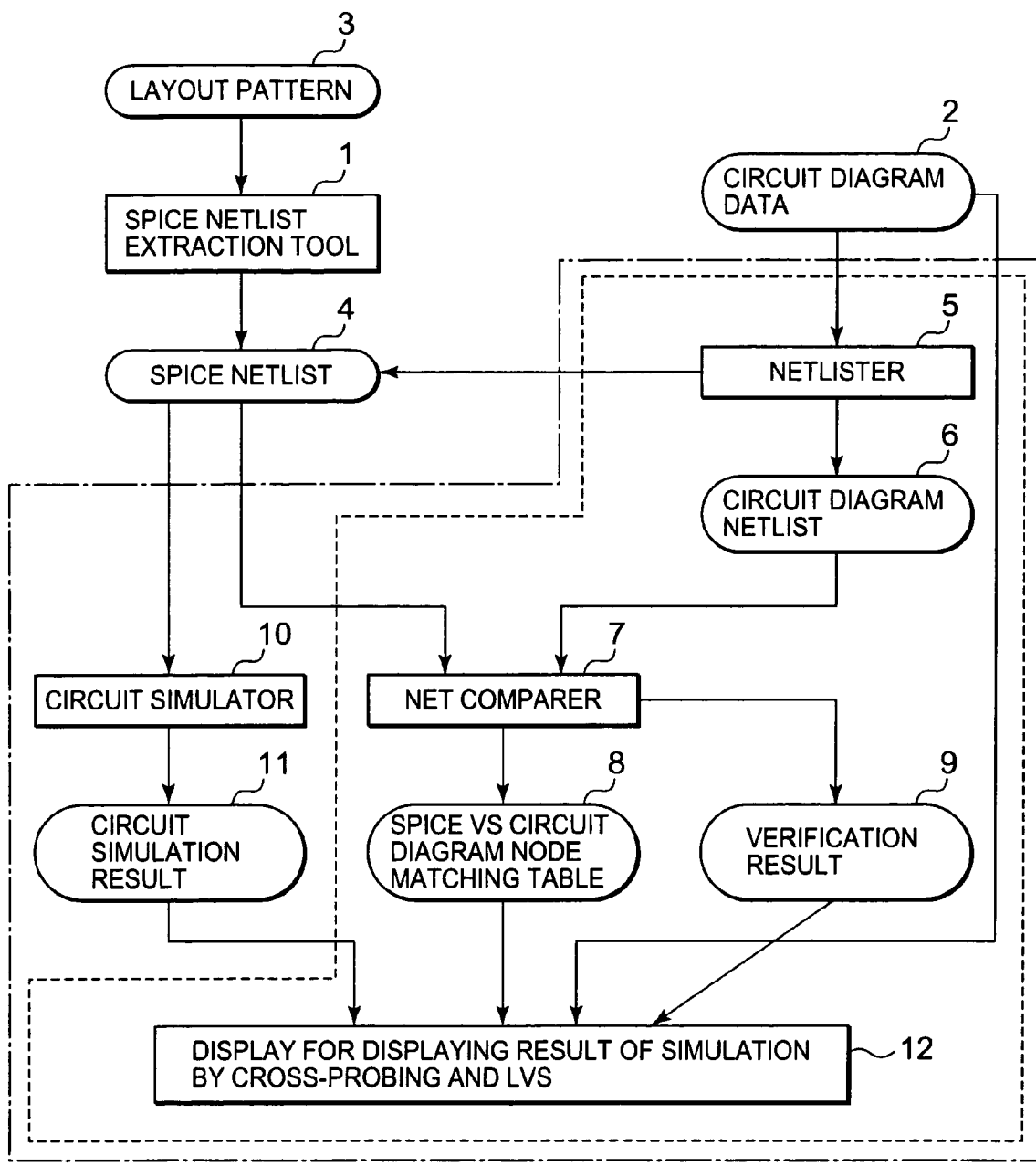
FIG. 5 is a flowchart shown by FIG. 1 of Patent Document 1.

Next, considered is a specific example where the circuit diagram data D1 in the exemplary embodiment is a transistor (the gate length L, the gate width W) and GDS2 F1 is the layout cell 100c in FIG. 4C. Two transistors defined by the channel regions 103a and 103b are extracted from the layout cell 100c by the netlist extraction Step S01 to create the layout netlist F2.

In the layout netlist reduction Step S02, a fact that the two transistors defined by the channel regions 103a and 103b compose a single transistor is recognized, and the after reduction layout netlist F3 and the before and after reduction association table F4 are created. Here, a fact that the number of transistors before reduction is two, the origin point 104a of the transistor defined by the channel region 103a, and the origin point 104b of the transistor defined by the channel region 103b are written into the before and after reduction association table F4.

On the other hand, in Step S03, the transistor on the circuit diagram is outputted by the netlister to the circuit diagram netlist F7.

In the net comparison (LVS) Step S04, it is recognized that the transistor on the circuit diagram and the two transistors defined by the channel regions 103a and 103b, which are recognized as one transistor due to reduction, are on a one-to-one basis, and records in the circuit diagram vs layout association table F5.

In the GDS2 search process Step S05, the two transistor origin points 104a and 104b are detected by searching for transistor origin points on the layout cell 100c. Here, it agrees with a fact that the number of transistors before reduction recorded in the before and after reduction association table F4 is two. Therefore, it is possible to specify that the two transistors defined by the channel regions 103a and 103b are the transistor on the layout cell 100c and to create mapping information associating the transistor on the circuit diagram with the layout cell 100c on a one-to-one basis.

Next, considered is a case where the circuit diagram data D1 is set to be a transistor (the gate length L, the gate width W) and transistors on a layout is set as in FIG. 4B, for example. As described above, mapping information associating a transistor on a diagram circuit with layout cells 100a and 100b on a one-to-two basis is required to realize the cross-probing of the transistor on the circuit diagram and the layout cells 100a and 100b in FIG. 4B.

Firstly, in the netlist extraction Step S01, the transistor defined by the channel region 103a from the layout cell 100a is extracted, the transistor defined by the channel region 103b from the layout cell 100b is extracted, and the layout netlist F2 is created.

Next, in the layout netlist reduction Step S02, it is recognized that the two transistors defined by the channel regions 103a and 103b compose one transistor. Then, the after reduction layout netlist F3 and the before and after reduction association list F4 are created. Here, a fact that the number of transistors before reduction is two, the origin point 104a of the transistor defined by the channel region 103a and the origin point 104b of the transistor defined by the channel region 103b are written into the before and after reduction association table F4.

On the other hand, in Step S03, the transistor on the circuit diagram is outputted to the circuit diagram netlist F7 by the netlister.

Next, in Step S04, the net comparison (LVS) recognizes that the transistor on the circuit diagram and the two transistors defined by the channel regions 103a and 103b, which are recognized as one transistor due to reduction, are on one-to-one basis, and records it on the circuit diagram vs layout association table F5.

In the GDS2 search processing S05, the transistor origin point on the layout cell 100a is searched to detect the transistor origin point 104a. Even if it does not agree with the fact that two is the number of the transistors before reduction recorded on the before and after reduction association table F4, it is possible to recognize that the transistor defined by the channel region 103a is the transistor on the layout cell 100b.

In addition, the transistor origin point on the layout cell 100b is searched for, and the transistor origin point 104b is detected. Even if it does not agree with the fact that two is the number of transistors before reduction recorded in the before and after reduction association table F4, it is possible to recognize that the transistor defined by the channel region 103b is the transistor on the layout cell 100b.

Here, a fact that the number of transistors before reduction is two is recorded in the before and after reduction association table F4. Therefore, it is possible to create mapping information associating the transistor on the circuit diagram with the layout cells 100a and 100b on a one-to-two basis.

In this manner, it is possible to create mapping information associating a circuit element with layout cells on a one-to-plurality basis, even in a layout where a transistor on a circuit diagram is composed of a plurality of transistor cells including a transistor on a layout.

Next, considered is a case where the circuit diagram data D1 is set to be a transistor (the gate length L, the gate width W) and a transistor on a layout is set as in FIG. 4A, for example. Mapping information associating the transistor on the circuit diagram with the layout cell 100 on a one-to-one basis is required to perform the cross-probing of the transistor on the circuit diagram and the layout cell 100 in FIG. 4A.

In the netlist extraction Step S01, the transistor defined by the channel region 103 is first extracted from the layout cell 100 to create the layout netlist F2.

Next, in the layout netlist reduction Step S02, it is recognized that the number of transistors defined by the channel region 103 is one, and the after reduction layout netlist F3 and the before and after degeneration association table F4 are created. At this point, a fact that the number of transistors is one also before reduction and the origin point 104 of the transistor defined by the channel region 103 are written into the before and after reduction association table F4.

On the other hand, the transistor on the circuit diagram is outputted to the circuit diagram netlist F7 by the netlister step S03.

Next, in Step S04, the net comparison (LVS) recognizes that the transistor on the circuit diagram and the one transistor defined by the channel region 103 are on a one-to-one basis, and records it in the circuit diagram vs layout association table F5.

In the GDS2 search process Step S05, the transistor origin point on the layout cell 100 is searched to detect the transistor origin point 104. Here, a fact that the number of transistors before reduction recorded on the before and after reduction association table F4 is also one agrees with a fact that the number of transistor origin points detected is one. Hence, it is possible to specify that the transistor defined by the channel region 103 is the transistor on the layout cell 100. As a result, it is possible to create mapping information associating the transistor on the circuit diagram with the layout cell 100 on a one-to-one basis.

In this manner, it is possible to create mapping information associating a circuit element with a layout cell on a one-to-one basis, even when a transistor on a circuit diagram is configured of one layout cell including one transistor on a layout.

The exemplary embodiment of the present invention makes it possible to create mapping information in which association is performed on a one-to-one basis, even when a circuit transistor on a single circuit diagram is configured as a single transistor cell including a plurality of transistors on a layout. Therefore, it is possible to perform the cross-probing for more layout cells when a layout corresponding to a circuit diagram is designed by reading GDS2 in an integrated design system functioning as a circuit diagram editor and a layout editor.

Further, it is noted that Applicant's intent is to encompass equivalents of all claim elements, even if amended later during prosecution.

What is claimed is:

1. A computer-implemented layout design method of a semiconductor integrated circuit, comprising:

degenerating, by a processor, a layout netlist extracted from a layout data, to produce a degenerated layout netlist;

comparing the degenerated layout netlist with a circuit diagram netlist, to produce a layout circuit association table of a degenerated layout cell and a circuit element;

creating a before and after reduction association table based on the layout netlist and the degenerated layout netlist;

counting a number of layout elements in a layout cell before the degenerating;

comparing the number of layout elements counted and a number of degenerated elements; and creating a mapping information associating the layout cell with the circuit element.

2. The layout design method according to claim 1, further comprising:
recording a coordinate of the layout element before the degenerating in reference to the layout circuit association table and the before and after reduction association table.

3. The layout design method according to claim 1, wherein the mapping information is produced when the number of layout elements counted agrees with the number of the degenerated elements.

4. The layout design method according to claim 1, wherein a plurality of layout elements are included in the layout cell.

5. The layout design method according to claim 1, wherein the layout data comprises a mask pattern file in a binary.

6. A non-transitory computer-readable medium storing a computer program for causing a computer to perform a circuit layout design, comprising:
obtaining a degenerated element information from a layout information;
adding the degenerated element information and a layout before degenerating of the degenerated element information, into a circuit element list;
extracting a layout cell from a layout cell list; and
extracting a circuit element before degenerating in the layout cell extracted, from the circuit element list; and
counting the circuit element before degenerating in the layout cell extracted.

* * * * *